(12) United States Patent
Akiba et al.

(10) Patent No.: US 8,017,959 B2
(45) Date of Patent: Sep. 13, 2011

(54) LIGHT SOURCE AND LIQUID CRYSTAL DISPLAY DEVICE USING THE SAME

(75) Inventors: Yutaka Akiba, Hitachi (JP); Hiroki Kaneko, Hitachinaka (JP); Ikuo Hiyama, Hitachinaka (JP); Toshiaki Tanaka, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 786 days.

(21) Appl. No.: 11/654,665

(22) Filed: Jan. 18, 2007

(65) Prior Publication Data
US 2007/0194340 A1 Aug. 23, 2007

(30) Foreign Application Priority Data
Feb. 17, 2006 (JP) .................................. 2006-040109

(51) Int. Cl.
*H01L 33/00* (2010.01)
(52) U.S. Cl. .............................. 257/98; 257/99; 257/100
(58) Field of Classification Search ............. 257/98–100
See application file for complete search history.

(56) References Cited

U.S. PATENT DOCUMENTS

| 6,410,642 | B1 * | 6/2002 | Yamakawa et al. | 524/847 |
| 2004/0222516 | A1 * | 11/2004 | Lin et al. | 257/712 |
| 2005/0236638 | A1 * | 10/2005 | Tsukagoshi | 257/99 |

FOREIGN PATENT DOCUMENTS

| JP | 04-196449 | 7/1995 |
| JP | 2003-162626 | 6/2003 |
| JP | 2005-012155 | 1/2005 |

* cited by examiner

*Primary Examiner* — Samuel A Gebremariam
(74) *Attorney, Agent, or Firm* — Antonelli, Terry, Stout & Kraus, LLP.

(57) ABSTRACT

A widely applicable and low cost module substrate with a high accuracy, reliability and heat-radiation structure. A light source includes: a heat radiation substrate; an insulating layer formed in some regions in an upper surface of the substrate; a wiring layer having wiring patterns, the wiring layer being arranged on the insulating layer; and a plurality of LED elements connected to the wiring layer. Moreover, the light source includes: a heat radiation substrate; an insulating layer arranged in some regions in an upper surface of the substrate; a wiring layer having wiring patterns, the wiring layer being arranged on the insulating layer; and LED elements connected to the wiring layer, wherein the insulating layer has two layers of a resin layer arranged in the wiring layer side and an adhesive layer arranged in the heat radiation substrate side.

20 Claims, 11 Drawing Sheets

FIG.5A-a
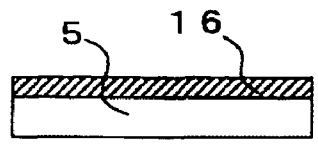
FIG.5A-b
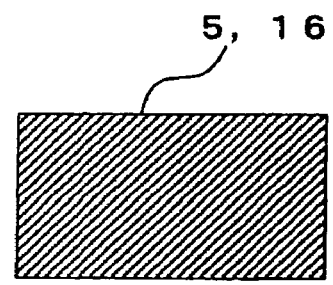
FIG.5B-a
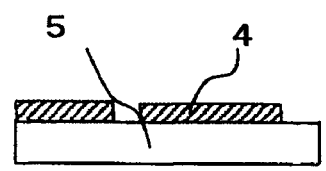
FIG.5B-b
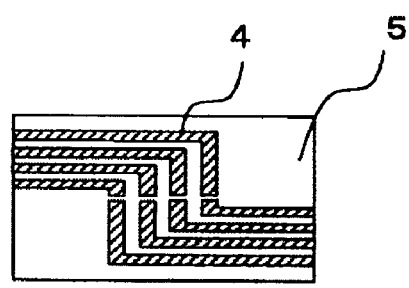
FIG.5C-a
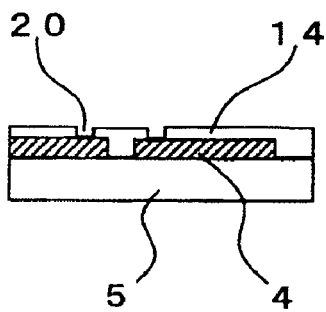
FIG.5C-b
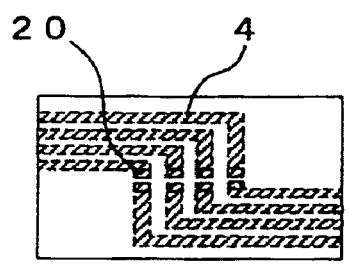

FIG.5D-a
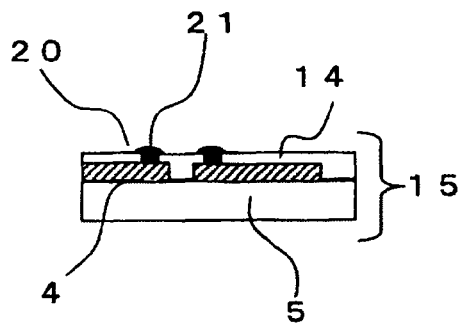
FIG.5D-b
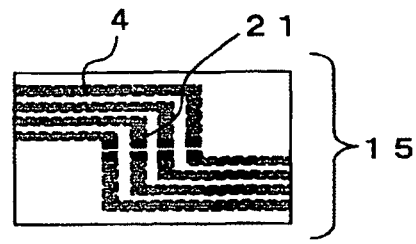
FIG.5E-a
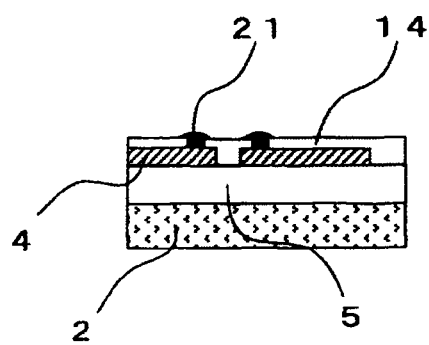
FIG.5E-b
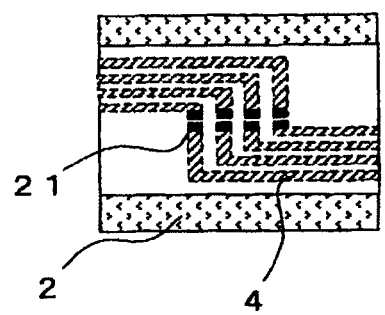
FIG.5F-a
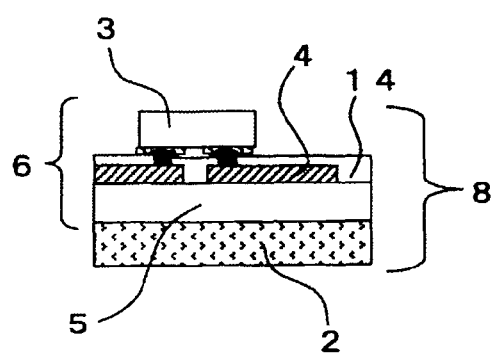
FIG.5F-b
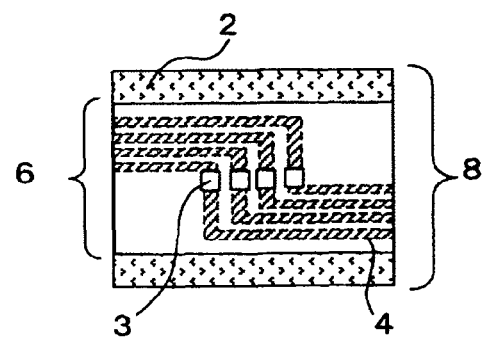

FIG.11A-a
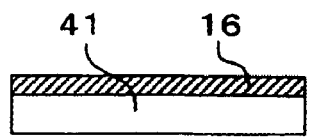
FIG.11A-b
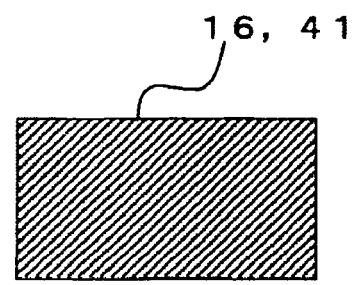
FIG.11B-a
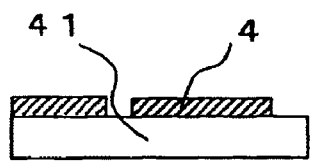
FIG.11B-b
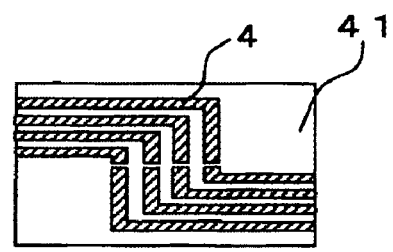
FIG.11C-a
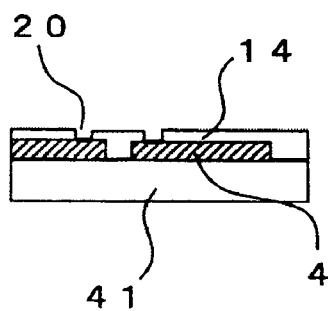
FIG.11C-b
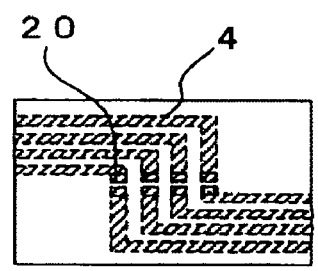

FIG.11D-a
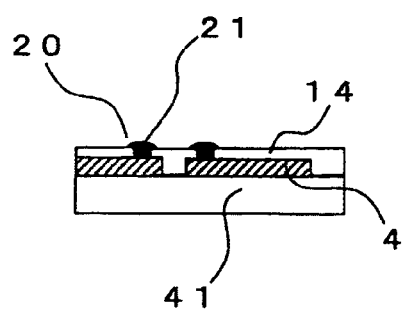
FIG.11D-b
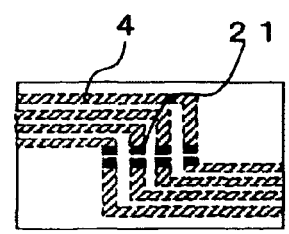
FIG.11E-a
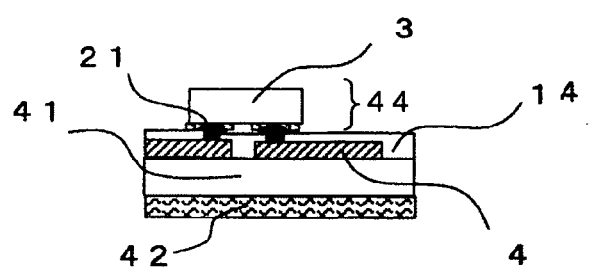
FIG.11E-b
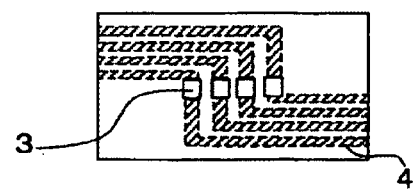
FIG.11F-a
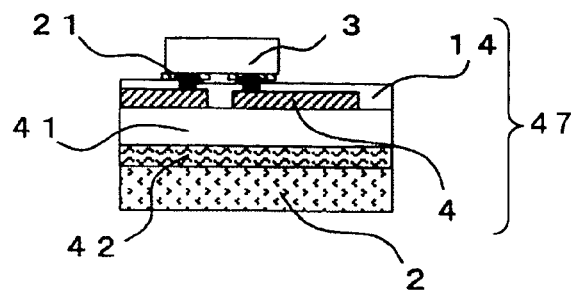
FIG.11F-b
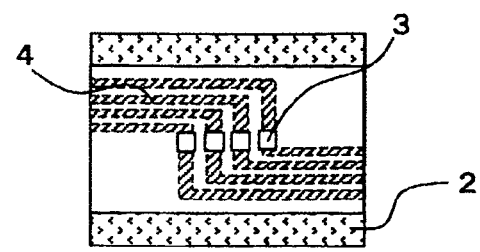

LIGHT SOURCE AND LIQUID CRYSTAL DISPLAY DEVICE USING THE SAME

BACKGROUND OF THE INVENTION

1. Field of the Invention

The present invention relates to a module substrate in which an LED chip, which is a light emitting element and a heater element, is mounted, and also relates to a liquid crystal display device and a light source to which this module substrate is applied.

2. Description of the Related Art

A chip mount technology includes various types, such as a tape carrier, a ceramic carrier and a silicon sub-mount, in which a wiring layer is formed on various types of insulating layers. In this case, although high accuracy and high reliability mounting may be provided, the material cost of members is often a problem. Moreover, when a high heat radiation structure is required, an insulating layer formed in a heat radiation base material, such as aluminum, is required to have a high thermal conductivity, which is difficult to be handled by the above-described carriers and the like. For this reason, as seen in a metal core substrate in the prior arts, a modular structure (module substrate) composed of a wiring layer, an insulating layer, and a heat radiation substrate is employed, and in the insulating layer a high thermal conductivity material that allows heat radiation is used. JP-A-2003-162626 describes a structure, wherein a film substrate, which is an insulating layer, is provided on a heat radiation substrate and on top of this a wiring layer and an LED chip are mounted.

SUMMARY OF THE INVENTION

However, in the above-described prior arts, in the manufacturing process of the metal core base material, a wiring layer made of copper foil and an insulating layer are formed in the whole surface as to conform to the shape of the surface of the heat radiation base material prior to processing, and the insulating layer is also formed in regions where a wiring pattern after the processing does not exist. Accordingly, especially when the dimensions and shapes of the heat radiation base material used become large, even if the finished wiring-pattern region (area) is small, a module substrate should be used, in which a wiring copper foil layer (wiring layer) and insulating layer conforming to the heat radiation base material are formed. At the same time, the possessing (etching or the like) to remove the copper foil needs to be carried out also to a wiring copper foil layer that does not require a wiring pattern, which leads to cost increase. With an increase in size of the heat radiation base material, an increase in size of the etching equipment or the like is also required for a copper foil pattern formation processing carried out to a copper-foil clad wiring layer. Moreover, the metal core substrate is processed from a base material structure that integrates the wiring layer, insulating layer, and heat radiation base material in one flat surface, and therefore, if the surface of the heat radiation base material is formed from different flat surfaces, there is a constraint that the wiring layer and insulating layer may not be formed on the heat radiation base material. Especially when a large-sized heat radiation base material (housing) is required in a display device, a light source, or the like, there are many cases having different flat surfaces for assembly of the heat radiation structure, a strength design, and the like, so that it is basically difficult to apply the metal core substrate.

The present invention solves the above-described problems. The object of the present invention is to provide a widely applicable module substrate at low cost while achieving a high accuracy and high reliability mounting and a high heat-radiation structure at the same time.

In order to solve the above-described problems, in the present invention, a light source comprises: a heat radiation substrate; an insulating layer adhered to some regions in an upper surface of the heat radiation substrate; a wiring layer in which a plurality of wiring patterns are formed, the wiring layer being arranged on the insulating layer; and a plurality of LED elements connected to the wiring layer. Here, the insulating layer is separately formed in two or more regions in the upper surface of the heat radiation substrate, and the insulating layer is also formed in the upper surface of the heat radiation substrate along a wiring pattern of the wiring layer. Moreover, the insulating layer is formed in a tape form along a wiring pattern of the wiring layer, and a plurality of the insulating layers of a tape form are formed in a part of the upper surface of the heat radiation substrate.

In the present invention, the wiring layer and the heat radiation substrate are adhered to the insulating layer, respectively, under different heat-curing conditions. The light source includes: a first heat-curing step of adhering the wiring layer to the insulating layer; and a second heat-curing step of adhering the heat radiation substrate to the insulating layer. Moreover, in the light source, the first heat-curing step is a step of heating the insulating layer from the wiring layer side and cooling from the heat radiation substrate side. Moreover, in the light source, the heat radiation substrate has regions of different substrate thicknesses, and the insulating layer is formed in a region of the same substrate thickness in the upper surface of the heat radiation substrate. Moreover, in the light source, the heat radiation substrate has a heat pipe inside the substrate, and furthermore the heat pipe is provided corresponding to a region in which the insulating layer is formed.

Moreover, in the present invention, the light source comprises: a heat radiation substrate; an insulating layer arranged in some regions in an upper surface of the heat radiation substrate; a wiring layer in which a plurality of wiring patterns are formed, the wiring layer being arranged on the insulating layer; and a plurality of LED elements connected to the wiring layer, wherein the insulating layer is composed of two layers of a resin layer arranged in the wiring layer side and an adhesive layer arranged in the heat radiation substrate side. Moreover, in the light source, the resin layer is made of a thermosetting epoxy resin and the adhesive layer is made of an acrylic pressure sensitive adhesive.

Moreover, a liquid crystal display device comprises: a liquid crystal display panel including a pair of substrates, a pair of polarizing plates, and a liquid crystal layer sandwiched by the pair of substrates; and the above-described light source as a light source for providing light to the liquid crystal display panel.

Moreover, in the present invention, a method of manufacturing the light source includes: a first heat-curing step of adhering an insulating layer to a metal foil layer; a step of forming a wiring layer by processing the metal foil layer; a second heat-curing step of adhering the insulating layer to a heat radiation substrate; and a step of mounting an LED chip on the wiring layer, wherein the first heat-curing step is a step of heating the insulating layer from the wiring layer side and cooling from the heat radiation substrate side.

The present invention is widely applicable, and is effective in achieving a lower cost due to significant reduction in material of members in addition to achieving high accuracy, high reliability, and high heat radiation.

BRIEF DESCRIPTION OF THE DRAWINGS

FIG. 5A-*a* shows a cross sectional view of a manufacturing process 1 of a light source carrier 6 and a light source module substrate 8.

FIG. 5A-*b* shows a top view of the manufacturing process 1 of the light source carrier 6 and the light source module substrate 8.

FIG. 5B-*a* shows a cross sectional view of a manufacturing process 2 of the light source carrier 6 and the light source module substrate 8.

FIG. 5B-*b* shows a top view of the manufacturing process 2 of the light source carrier 6 and the light source module substrate 8.

FIG. 5C-*a* shows a cross sectional view of a manufacturing process 3 of the light source carrier 6 and the light source module substrate 8.

FIG. 5C-*b* shows a top view of the manufacturing process 3 of the light source carrier 6 and the light source module substrate 8.

FIG. 5D-*a* shows a cross sectional view of a manufacturing process 4 of the light source carrier 6 and the light source module substrate 8.

FIG. 5D-*b* shows a top view of the manufacturing process 4 of the light source carrier 6 and the light source module substrate 8.

FIG. 5E-*a* shows a cross sectional view of a manufacturing process 5 of the light source carrier 6 and the light source module substrate 8.

FIG. 5E-*b* shows a top view of the manufacturing process 5 of the light source carrier 6 and the light source module substrate 8.

FIG. 5F-*a* shows a cross sectional view of a manufacturing process 6 of the light source carrier 6 and the light source module substrate 8.

FIG. 5F-*b* shows a top view of the manufacturing process 6 of the light source carrier 6 and the light source module substrate 8.

FIG. 11A-*a* shows a cross sectional view of a manufacturing process 1 of a light source carrier 44 for providing FIG. 10 and a light source module substrate 47 using the same.

FIG. 11A-*b* shows a top view of the manufacturing process 1 of the light source carrier 44 for providing FIG. 10 and the light source module substrate 47 using the same.

FIG. 11B-*a* shows a cross sectional view of a manufacturing process 2 of the light source carrier 44 for providing FIG. 10 and the light source module substrate 47 using the same.

FIG. 11B-*b* shows a top view of the manufacturing process 2 of the light source carrier 44 for providing FIG. 10 and the light source module substrate 47 using the same.

FIG. 11C-*a* shows a cross sectional view of a manufacturing process 3 of the light source carrier 44 for providing FIG. 10 and the light source module substrate 47 using the same.

FIG. 11C-*b* shows a top view of the manufacturing process 3 of the light source carrier 44 for providing FIG. 10 and the light source module substrate 47 using the same.

FIG. 11D-*a* shows a cross sectional view of a manufacturing process 4 of the light source carrier 44 for providing FIG. 10 and the light source module substrate 47 using the same.

FIG. 11D-*b* shows a top view of the manufacturing process 4 of the light source carrier 44 for providing FIG. 10 and the light source module substrate 47 using the same.

FIG. 11E-*a* shows a cross sectional view of a manufacturing process 5 of the light source carrier 44 for providing FIG. 10 and the light source module substrate 47 using the same.

FIG. 11E-*b* shows a top view of the manufacturing process 5 of the light source carrier 44 for providing FIG. 10 and the light source module substrate 47 using the same.

FIG. 11F-*a* shows a cross sectional view of a manufacturing process 6 of the light source carrier 44 for providing FIG. 10 and the light source module substrate 47 using the same.

FIG. 11F-*b* shows a top view of the manufacturing process 6 of the light source carrier 44 for providing FIG. 10 and the light source module substrate 47 using the same.

DETAILED DESCRIPTION OF THE EMBODIMENTS

Modes for carrying the present invention will be described hereinafter.

Embodiment 1

A first embodiment of the present invention is described using FIG. 1 to FIG. 5.

Figure 1:
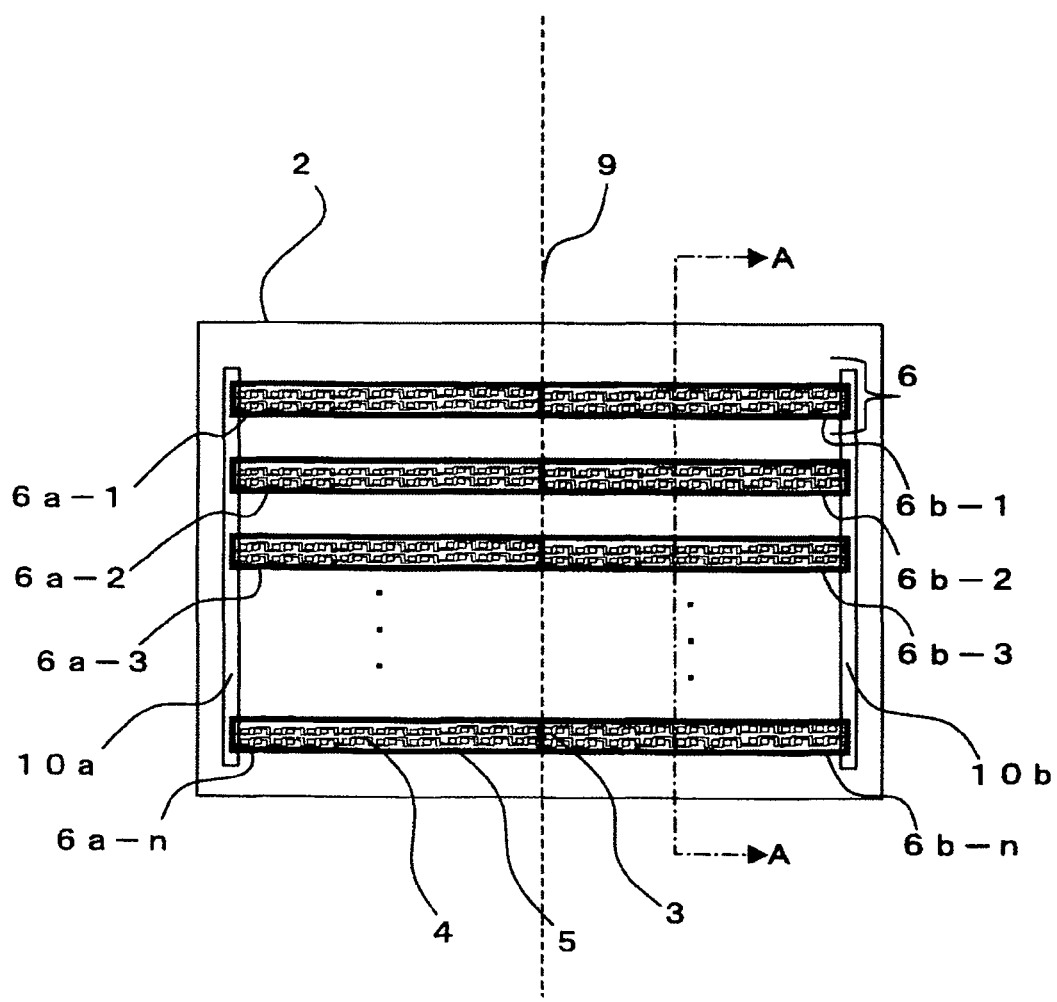
FIG. 1 is an embodiment of the present invention and shows a top view.
Figure 3:
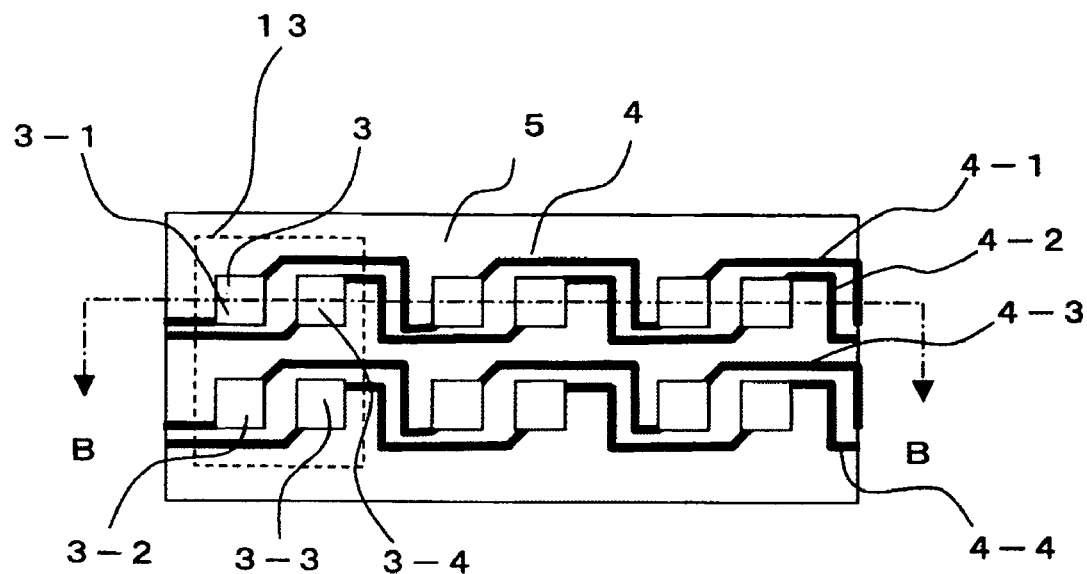
FIG. 3 shows a top view of a light source carrier 6.

FIG. 1 shows a top view of a light source module in which LED elements are mounted. A housing 2 is a large sized heat radiation base material, in which a light source carrier 6 is formed. The light source carrier 6 comprises an insulating layer 5, wiring 4, and an LED chip 3, and is arranged in a plurality of rows in parallel, while being divided into two, 6*a* (6*a*-1, ..., 6*a*-*n*) and 6*b* (6*b*-1, ..., 6*b*-*n*) across a center line 9. Circuit boards 10*a* and 10*b* for driving the light source carriers 6*a* and 6*b* divided into two are connected to the both sides of the light source carrier 6. The light source carrier 6 may be formed of one piece instead of being divided into the right and left sides of the center line 9. In this case, the circuit boards 10 may be unified. Moreover, in order to meet the requirements of display devices and light sources, the circuit board 10 may be arranged in the periphery of the upper and lower sides other than at the both sides of the housing 2 depending on the arrangement structure and drive method of the light source carrier 6. The details of the light source carrier are shown in FIG. 3. Four wiring patterns 4 (4-1, 4-2, 4-3, 4-4) formed on the insulating layer 5 are formed substantially in parallel while connecting a plurality of LED chips 3 (3-1, 3-2, 3-3, 3-4) in series, with four pieces of RGGB being a base unit 13 of LED chips. A protective resist pattern is formed in the surface of the wire 4 and the insulating layer 5 except for the connecting portion of the LED chip 3.

Figure 2:
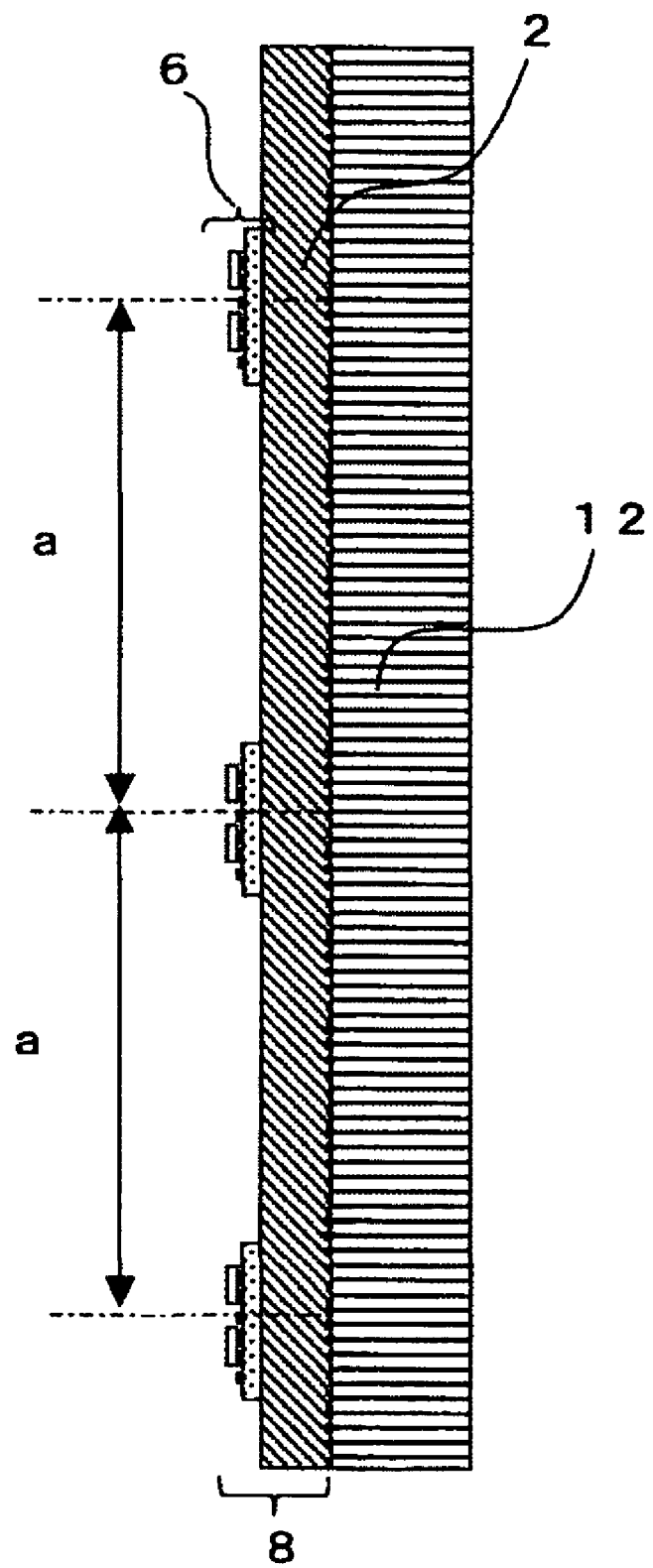
FIG. 2 shows a cross sectional view along the A-A line of FIG. 1.

FIG. 2 shows a cross sectional view of the A-A line of FIG. 1. In order to secure a high heat-radiation structure and the homogeneity of optical brightness in the housing 2 made of heat radiation base material, such as aluminum, the light source carrier 6 discretely arranged in array at a certain interval a is formed to form a light source module substrate 8. In the surface positioned on the opposite side of the light source carrier 6 arranged in the housing 2, a radiation fin 12 is attached with screws via a thermally conductive sheet or silicone grease in order to radiate a heat generated in the light source carrier 6.

Figure 4:
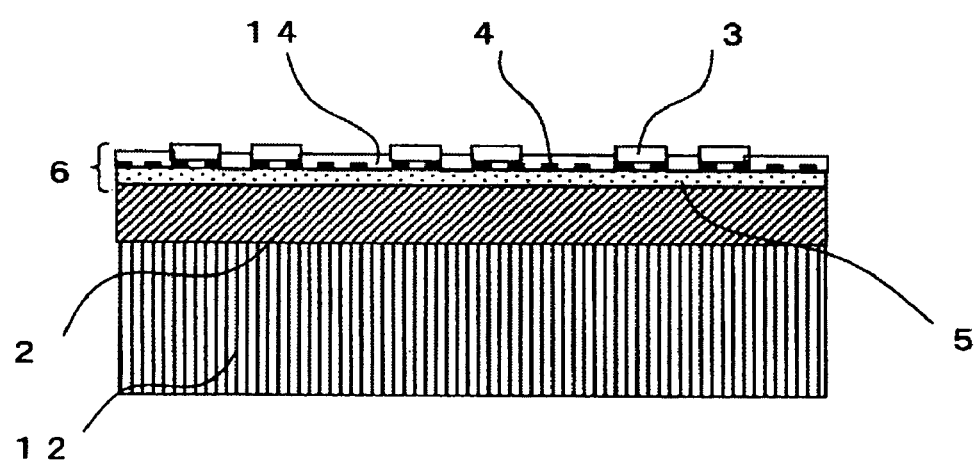
FIG. 4 shows a cross sectional view along the B-B line of FIG. 3.

FIG. 4 shows a cross sectional view of the B-B line of FIG. 3. On top of the housing 2 as the heat radiation base material, there is disposed the light source carrier 6 in which the LED chip 3 is mounted, and in the surface of the wiring pattern 4 and the insulating layer 5 except for the connecting portion of the LED chip 3, a protective resist pattern 14 is formed. This protective resist pattern 14 secures the insulation reliability and connection reliability of the connecting portion of the LED chip 3 and the wiring pattern 4, and at the same time improves the light extraction efficiency using a material having a white reflectivity of 90% or more. The light source carrier 6 is adhered to a flat surface of the housing 2 by the insulating layer 5 which is one of the constituent elements.

In the structures shown in the above-described FIG. 1 to FIG. 4, the insulating layer 5 is not arranged all over the housing 2, but is arranged discretely only in regions having the LED chip 3 or the wiring 4. This allows for achieving a wide applicability and a lower cost due to significant reduction in the material of members, in addition to achieving high accuracy, high reliability, and high heat radiation. Next, the manufacturing steps for achieving such structure are described using FIG. 5.

FIG. 5A to FIG. 5F (FIGS. 5A and 5B, . . . , FIG. 5F) describe the fabrication steps of a LED chip circuit board 15 formed of a wiring composed of the insulating layer and processed wiring, and also the fabrication steps of the light source module substrate 8 connected to the housing and having LED chips provided thereon. In addition, a and b used in FIG. 5*k-a* and FIG. 5*k-b* (k=A, B, . . . , F) indicate the cross sectional view and the top view, respectively.

FIG. 5B shows a copper-clad resin film of a tape form that integrates a wiring (before processing) 16 made of a wiring copper foil layer with the insulating layer 5 made of a high heat-conductive resin. The wiring (before processing) 16 and the insulating layer 5 are not actual-cured at high temperature, but are sealingly formed by simply press-adhering. For the insulating layer 5, a thermosetting epoxy resin containing a filler, such as alumina oxide, is used in order to obtain a high heat-radiation structure.

In FIG. 5B, the wiring (before processing) 16 of copper-clad resin film of a tape form undergoes a copper foil etching process, and thereby the wiring pattern 4 is formed in the insulating layer 5. The wiring pattern 4 takes various forms and various routing structures depending on the arrangement of the LED chip 3. In the copper foil etching process, in order to prevent an etching solution from penetrating between the wiring pattern 4 and the insulating layer 5, the copper-clad resin film of a tape form is actual-cured and adhered to the insulating layer 5 in advance. At this time, the actual-curing of the insulating layer 5 is limited to the vicinity of an interface in contact with the wiring (before processing) 16, not to the whole insulating layer 5 (including both surfaces). On the other hand, the opposite side surface of the wiring (before processing) 16 of the insulating layer 5 is temperature controlled to prevent the curing from advancing, because the opposite side surface will be adhered individually to the flat surface of the housing 2, which is the heat radiation base material, in the subsequent step.

In the heating method at this time, a uniform heating is carried out from the good heat-conductive wiring (before processing) 16 side using a heating jig and the temperature of the contacting surface with the insulating layer 5 is maintained within the actual-curing temperature (in the range from 150° C. to 180° C.) for a certain period of time. At the same time, in the opposite side surface of the insulating layer 5, the temperature rise is suppressed so as to prevent the actual-curing from advancing. Namely, in the light source module substrate having at least a wiring obtained by processing the wiring (before processing) 16, the insulating layer, and the heat radiation base material of the housing, the thermosetting resin layer is used as the insulating layer, and in the actual-curing at the first stage, first, only the vicinity of the contacting surface (interface) between the resin layer and the wiring layer is press-cured using a heating means from the wiring layer side, the heating means being for adhering the resin layer to the adjacent wiring layer, and a cooling means from the heat radiation base material side.

Since the opposite side surface of the wiring (before processing) 16 of the insulating layer 5 is not cured, a thin coating layer or a covering sheet is formed therein in advance for preventing the penetration of an etching solution or damages in the above-described etching process. In the actual-curing at the second stage, the resin layer made of the high heat-conductive resin insulating layer 5 is adhered to another adjacent heat radiation base material side. Although the coating layer may be removed at the time of actual-curing, a material (epoxy system resin) capable of being heat-adhered together with the insulating layer 5 is used, here.

In this way, the module substrate may be formed by the process that separates the insulating layer (resin layer), in which the wiring layer is formed, from the heat radiation base material by carrying two-stage curing to the resin layer.

In FIG. 5C, the protective resist pattern 14 is formed so as to cover the wiring 4, and at the same time, an opening 20 is also formed in an electrode portion of the wiring 4, to which the LED chip 3 is connected. For the material of the protective resist, an epoxy system resin of a white reflectivity of 90% or more is used to thereby improve the light extraction efficiency.

In FIG. 5D, a bump 21 to be connected with an LED chip is formed in the electrode portion of the opening 20 by Ni/Au plating. As the quality of the material of the bump, a solder bump may be used. By controlling the shape and structure of the bump 21 by means of the opening 20 of the protective resist pattern 14, the connection reliability between the wirings 4 of LED chips mounted in the subsequent step and the insulation reliability between the bumps 21 are improved.

A flexible circuit board 15 before an LED chip is mounted is formed by the processes of the above-described FIG. 5A to FIG. 5D. In the conventional manufacturing process of the metal core substrate, this flexible circuit board 15 is formed as the one integral with an aluminum board (housing) of a heat radiation base material. However, the above-described processes allows the flexible circuit board 15 to be separated from the heat radiation base material, and allows the flexible circuit board 15 to be provided as an independent structure. The insulating layer 5 constituting the flexible circuit board 15 may be adhered to the heat radiation base material (housing) in the opposite side surface of the surface, in which the wiring pattern is provided, by the following steps.

In FIG. 5E, the flexible circuit board 15 formed in a tape form is discretely arranged on a flat surface of the housing 2 and is adhered by a local thermcompression bonding (actual-curing). That is, the actual-curing is carried out as follows. The flexible circuit board 15 obtained in FIG. 5D is arranged aligning the surface of the insulating layer 5, in which the wiring 4 is not formed, with a flat surface of the housing 2 and then the insulating layer 5 is thermcompression bonded by a roll-type heating jig substantially aligned with the tape width, from the direction in which the wiring 4 is formed. A jig structure may be used, which does not compress-bond the vicinity of the bump 21 so as not give a thermcompression bonding damage to the bump 21. Moreover, the heat radiation base material of the housing 2 may be pre-heated in advance in order to carry out the actual-curing efficiently. The insulating layer 5 is adhered to the housing 2 after actual-curing the whole resin layer of the flexible circuit board 15.

In FIG. 5F, the LED chip 3 is mounted and connected. The light source carrier 6 composed of the LED chip 3, the protective resist pattern 14, the wiring 4, and the insulating layer 5 is adhered onto the heat radiation base material of the housing 2 to thereby form the light source module substrate 8.

In this way, use of the light source carrier 6 of the present invention in the light source module substrate decreases significantly the area ratio which the insulating layer 5, in which the wiring 4 is formed, accounts for in the housing 2, and thereby achieves a lower cost due to reduction in the amount of used material.

Embodiment 2

A second embodiment of the present invention is described using FIG. 6 to FIG. 9. Each view shows a modified example corresponding to the cross sectional view along the A-A line of FIG. 1.

Figure 6:
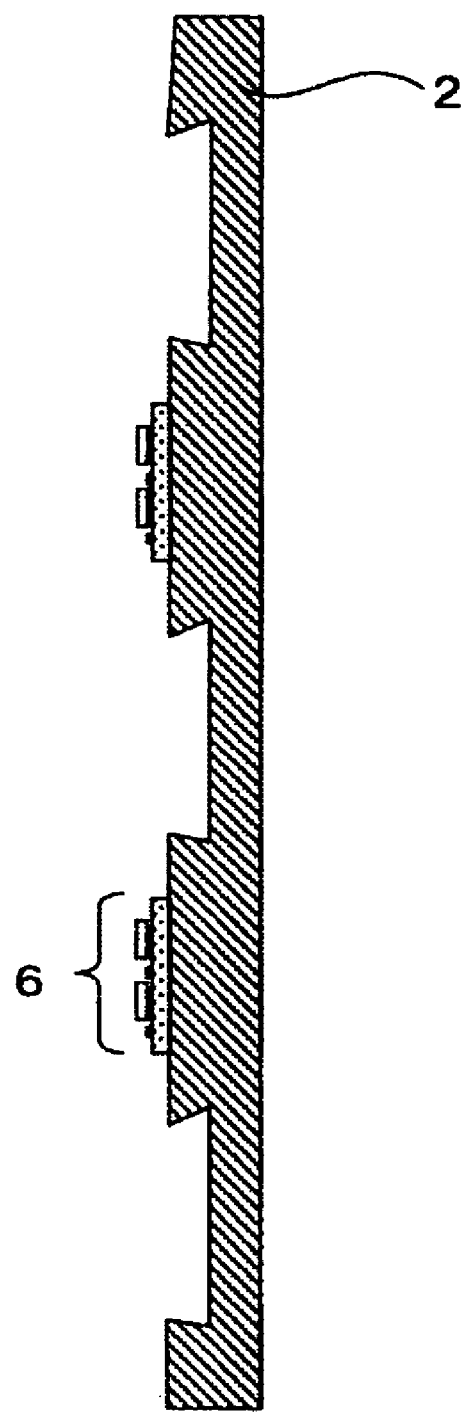
FIG. 6 is an embodiment of the present invention and shows a cross sectional view of a modified example of FIG. 2.
Figure 7:
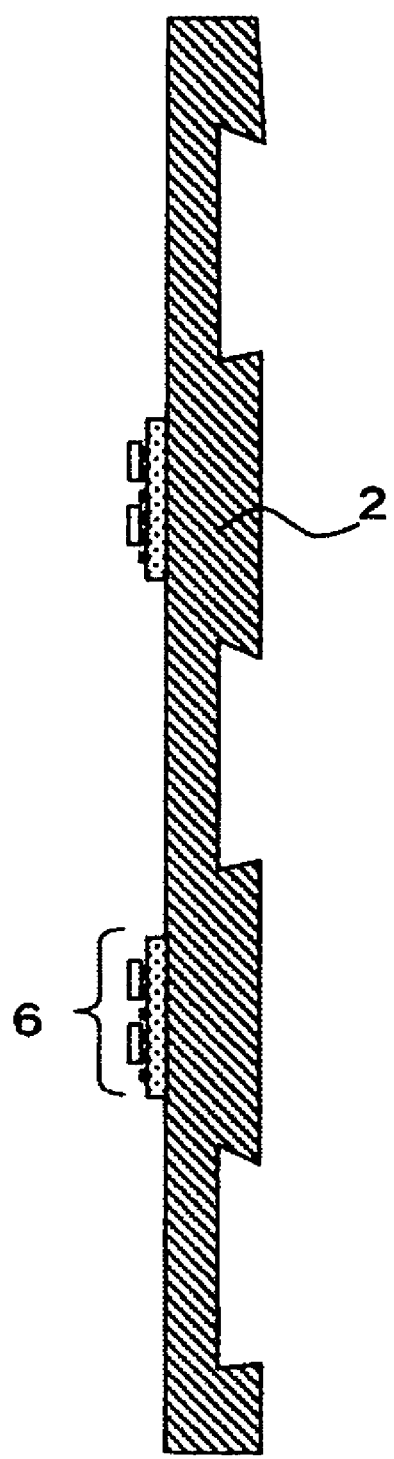
FIG. 7 is another modified example of FIG. 2 and shows a cross sectional view.
Figure 8:
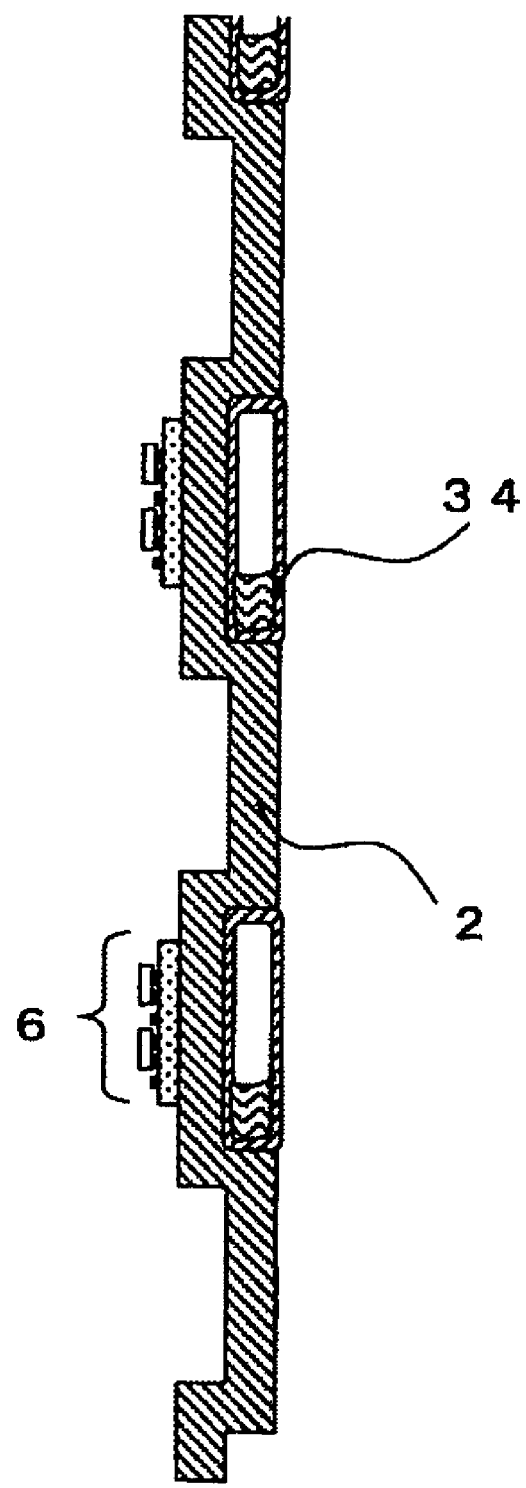
FIG. 8 is another modified example of FIG. 2 and shows a cross sectional view.
Figure 9:
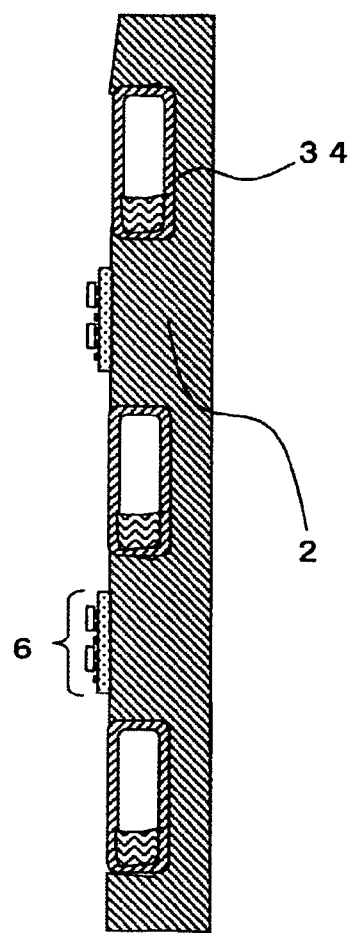
FIG. 9 is another modified example of FIG. 2 and shows a cross sectional view.

In FIG. 6 and FIG. 7, a heat radiation structure that increases the housing thickness for improving heat spreading is formed in flat surface regions of the housing 2, which is the heat radiation base material, the surface regions each being for forming the light source carrier 6, (the flat surface is divided into a plurality of area regions excellent in heat radiation structure). In FIG. 6, in the surface in which the light source carrier 6 is formed, and in FIG. 7, in the opposite surface, concavity and convexity are provided in the thickness of the housing. Similarly, in FIG. 8 and FIG. 9, a heat radiation structure using a heat pipe 34 for improving heat spreading and facilitating transferring the amount of heat is formed in flat surface regions of the housing 2, the flat surface regions each being for forming the light source carrier 6. This allows for achieving the suppression of the temperature rise of the housing and the uniformity of temperature distribution.

As described above, in this embodiment, the housing made of the heat radiation base material is formed from the flat surfaces of different heights or thicknesses (including three or more different heights or thicknesses), and each light source carrier is formed on at least one surface among the flat surfaces. Moreover, for example, the light source carrier is separately formed in the vicinity of a connecting step portion between the flat surfaces of different heights, which flat surfaces the housing, which is the heat radiation base material, has.

The processing of such housing is facilitated by following the manufacturing process shown in FIG. 5. That is, since in the process shown in the above-described FIG. 5, the housing is formed after the fabrication of the flexible circuit board and furthermore only some regions of the housing contain the light source carrier, the processing of the housings shown in FIG. 6 to FIG. 9 may be carried out easily.

Embodiment 3

Figure 10:
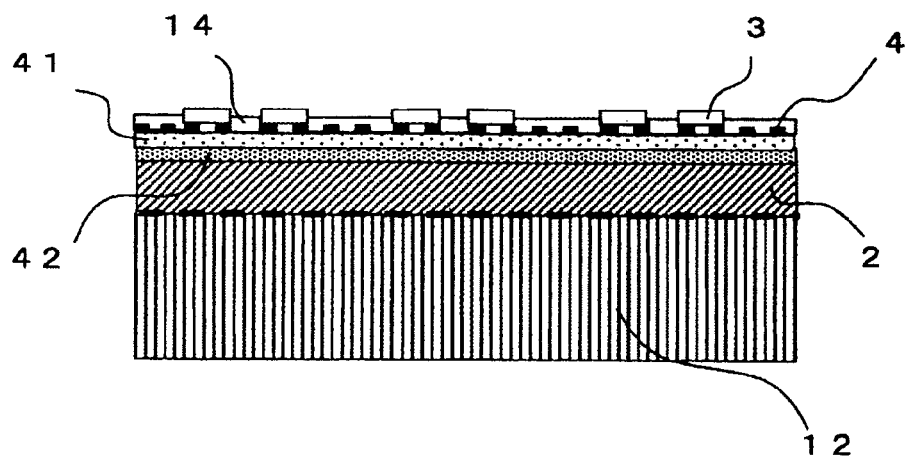
FIG. 10 is an embodiment of the present invention and shows a cross sectional view of a modified example of FIG. 4.

A third embodiment of the present invention is described using FIG. 10 and FIG. 11.

FIG. 10 shows a modified example of FIG. 4. The difference from FIG. 4 is in that the insulating layer 5 in FIG. 4 is composed of two layers of a resin layer 41 and an adhesive layer 42. That is, the wiring 4, the LED chip 3, and the like are formed above the housing 2 via the resin layer 41 and the adhesive layer 42 to thereby constitute a light source module substrate. The wiring 4 is provided in the surface of the resin layer 41, which is adhered to the housing 2 by the adhesive layer 42. Other structures are the same as those shown in FIG. 4.

In this embodiment, in place of two-stage curing shown in Embodiments 1 and 2, a double-layer insulating layer composed of the resin layer 41 plus the adhesive layer 42 is formed paying attention to the adhesive function and the like of the insulating layer. That is, the adhesion between the wiring 4 and the resin layer 41 for obtaining the etching resistance at the time of forming the wiring 4 is secured carrying out actual-curing to the whole resin layer 41 by thermcompression bonding. For the subsequent adherence between the resin layer 41 and the housing 2, which is the heat radiation base material, the function of the insulating layer is separated by newly adding the adhesive layer 42 having the adhesive function (which is required in the above-described two-stage curing). As a result, the insulating layer may be formed in any shape in a part of the flat surface other than in the whole flat surface of the housing 2, and is separately formed in regions excellent in at least the heat radiation structure of the housing 2 (a reduced thermal resistance region and the like in the radiation path). For the resin layer 41, a thermosetting epoxy resin is used in order to secure the adhesiveness to the wiring 4 and the insulation reliability in addition to securing the heat radiation. On the other hand, for the adhesive layer 42, an acrylic pressure sensitive adhesive is used in order to secure the adhesiveness between the housing 2, which is the heat radiation base material, and the resin layer 41, in addition to securing the heat radiation. For the purpose of improving the heat radiation, a material containing a high heat-conductive filler is used in both the resin layer 41 and the adhesive layer 42, and is thinned to 50 μm or less in thickness, for example.

In this way, making the insulating layer double-layered allows for achieving a wide applicability and a lower cost due to a significant reduction in the material of members in addition to achieving high accuracy, high reliability, and high heat radiation, without carrying out the two-stage curing. Next, the manufacturing process for achieving the structure of FIG. 10 is described using FIG. 11.

FIG. 11 (FIG. 11A, FIG. 11B, . . . , FIG. 11F) describe the manufacturing process of a flexible circuit board of LED chips, the flexible circuit board being composed of an insulating layer and a processed wiring, and furthermore the manufacturing process of a light source module substrate connected to the housing and having LED chips provided therein. In addition, a and b used in FIG. 11$k$-$a$ and FIG. 11$k$-$b$ ($k$=A, B, . . . , F) indicate the cross sectional view and the top view, respectively.

FIG. 11A shows a copper-clad resin film of a tape form, the copper-clad resin film integrating the wiring (before processing) 16 made of copper foil with the high heat-conductive resin layer 41. The resin layer 41 that forms a layered structure together with the wiring (before processing) 16 is actual-cured at temperatures in the range from 150° C. to 180° C., and is sealingly formed by thermcompression bonding. For the resin layer 41, a thermosetting epoxy resin containing a filler of an excellent thermal conductivity, such as alumina oxide and silicon nitride, is used in order to obtain a low thermal resistance structure.

FIG. 11B shows a base material, in which the wiring (before processing) 16 of a copper-clad resin film of a tape form undergoes a copper foil etching process and thereby a wiring pattern is formed on the high heat-conductive resin layer 41 constituting the insulating layer. The wiring pattern 4 takes various forms and various routing structures depending on the arrangement of the LED chips illustrated in the above-described FIG. 10. In the copper foil etching process, the copper-clad resin film of a tape form is actual-cured, and is adhered to the wiring (before processing) by the high heat-conductive resin layer 41 in advance so that an etching solution may not penetrate between the wiring pattern 4 and the high heat-conductive resin layer 41.

FIG. 11C shows the base material in which the protective resist pattern 14 is formed so as to protect the wiring 4. The opening 20 is also formed in the electrode portion of the wiring 4 to which electrode portion the LED chip 3 shown in the above-described FIG. 10 is connected. For the material of the protective resist, an epoxy system resin of a white reflectivity of 90% or more is used to thereby improve the light extraction efficiency.

FIG. 11D shows the base material, in which the bump 21 for connecting the above-described LED chip 3 shown in FIG. 10 to the electrode portion of the opening 20 by nickel/Au plating is formed. As the quality of the material of the bump, a solder bump may be used. The shape and structure of the bump 21 are controlled by the opening 20 of the protective resist pattern 14, thereby improving the connection reliability between the LED chip 3 mounted in the subsequent step and the wirings 4 and the insulation reliability between the LED chip 3 and the bumps 21.

FIG. 11E shows a light source carrier in which the LED chip 3 is mounted. The LED chip 3 is bonded to the wiring 4 by flip chip mounting at the stage where the insulating layer is formed from one resin layer 41. The LED chip 3 may be mounted by wire-bonding other than flip chip mounting. After mounting the LED chip 3, the periphery of the LED chip 3, the periphery including the protective resist pattern 14, is covered with a transparent resin, a white resin, or the like, thereby improving the optical properties, such as light extraction efficiency. Then, the adhesive layer 42 and the resin layer 41 are bonded together to constitute a double-layer insulating layer.

FIG. 11F shows a module substrate in which the light source carrier is mounted to the housing 2, which is the heat radiation base material. The light source carrier of a tape form having a certain width is adhered to a part of the flat surface of the housing 2 by the insulating adhesive layer 42. Because the light source carrier may be formed in any shape even in the case where the housing 2, which is the heat radiation base material, has a large-sized flat surface or a flat surface with a step structure, the module substrate is formed in a required flat surface region. That is, the module substrate does not need to be considered with respect to the whole flat surface region of the housing 2, and thus especially in case of a large sized heat radiation base material, the module members are reduced significantly.

Embodiment 4

By using the structures of the present invention described in the Embodiments 1 to 3, various kinds of members fabricated in the steps of manufacturing the light source module substrate may be provided flexibly, thereby achieving a significant lower cost including the simplification of the processing and the processing conditions, the improvement in mass production, and the like.

The providable members may include the followings.

Member 1: Base material of a copper-clad resin film of a tape form composed of the insulating layer and the wiring (before processing) in FIG. 5 and FIG. 11.

Member 2: Base material of a flexible circuit board of LED chips, the flexible circuit board being made of a wiring after forming the insulating layer and pattern in FIG. 5 and FIG. 11.

Member 3: Base material of a light source carrier composed of the LED chip, wiring, and insulating layer in FIG. 5 and FIG. 11. An inspection step of LED chips may be included at this stage.

Member 4: Base material of the light source carrier basically composed of the LED chip, wiring, resin layer, and adhesive layer in FIG. 11. A structure may be added, in which the periphery of the LED chip, the periphery including the protective resist pattern, is covered with a transparent resin, a white resin, or the like, thereby improving the optical properties, such as light extraction efficiency. Moreover, a release layer may be attached to the adhesive layer.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A light source comprising:
    a heat radiation substrate;
    an insulating layer, including a thermosetting epoxy resin, formed on an upper surface of the heat radiation substrate;
    a wiring layer in which a plurality of wiring patterns are formed, the wiring layer being arranged on the insulating layer;
    a plurality of LED elements connected to the wiring layer; and
    a protective resist pattern formed on upper surfaces of both the insulating layer and the wiring layer,
    wherein the insulating layer is arranged on the upper surface of the heat radiation substrate discretely in regions having an LED element and/or a wiring pattern.

2. The light source according to claim 1, wherein the thermosetting epoxy resin includes a filler of either aluminum oxide or silicon nitride.

3. The light source according to claim 1, wherein the insulating layer is separately formed in two or more regions in the upper surface of the heat radiation substrate, the heat radiation substrate and the insulating layer being arranged to be adhered through an adhesive layer that has been formed between the heat radiation substrate and the insulating layer.

4. The light source according to claim 1, wherein the insulating layer is formed in the upper surface of the heat radiation substrate along a wiring pattern of the wiring layer.

5. The light source according to claim 1, wherein the insulating layer is formed in a tape form along the wiring pattern of the wiring layer, and wherein a plurality of the insulating layers of a tape form are formed in a part of the upper surface of the heat radiation substrate.

6. The light source according to claim 1, wherein a radiation fin is disposed in an opposite side surface of the upper surface of the heat radiation substrate.

7. The light source according to claim 1, wherein the heat radiation substrate includes regions of two substrate thicknesses, wherein the insulating layer, the wiring layer and the plurality of LED elements are formed in a region of the greater substrate thickness in the upper surface of the heat radiation substrate.

8. The light source according to claim 1, wherein the heat radiation substrate includes a heat pipe inside the substrate.

9. The light source according to claim 8, wherein the heat pipe is provided on the region of the greater substrate thickness in the upper surface of the heat radiation substrate.

10. A liquid crystal display device, comprising:
a liquid crystal display panel comprising a pair of substrates, a pair of polarizing plates, and a liquid crystal layer sandwiched by the pair of substrates; and
the light source according to claim 1 for providing light to the liquid crystal display panel.

11. The light source according to claim 1, wherein the insulating layer is arranged on the upper surface of the heat radiation substrate discretely only in regions having an LED element and/or a wiring pattern.

12. The light source according to claim 1, wherein both the plurality of LED elements and the wiring layer are connected through an opening formed in the protective resist pattern.

13. The light source according to claim 1, wherein both the plurality of LED elements are provided on the protective resist pattern.

14. The light source according to claim 1, wherein the protective resist pattern formed of an epoxy system resin of a white reflectivity of at least 90%.

15. The light source according to claim 1, wherein the wiring layer and the heat radiation substrate are adhered to the insulating layer, respectively, under different heat-curing conditions.

16. The light source according to claim 15, wherein the wiring layer and the heat radiation substrate are adhered to the insulating layer, respectively, under different heat-curing conditions.

17. The light source according to claim 16, wherein the light source is formed by a first heat-curing step of adhering the wiring layer to the insulating layer, and a second heat-curing step of adhering the heat radiation substrate to the insulating layer.

18. The light source according to claim 1, wherein the light source is formed by a first heat-curing step of adhering the wiring layer to the insulating layer, and a second heat-curing step of adhering the heat radiation substrate to the insulating layer.

19. The light source according to claim 18, wherein the first heat-curing step is a step of heating the insulating layer from the wiring layer side and cooling from the heat radiation substrate side.

20. The light source according to claim 18, wherein the first heat-curing step of adhering the wiring layer to the insulating layer in the light source forming process, further comprises:
a step of actual curing of the insulating layer only limited to a vicinity of an interface in contact with the wiring pattern;
a step of thermally controlling an opposite surface of the wiring pattern of the insulating layer to prevent the curing from advancing; and
a step of adhering the opposite surface of the wiring pattern to a housing.

* * * * *